United States Patent
Tsai et al.

[19]

[11] Patent Number: 5,926,729
[45] Date of Patent: Jul. 20, 1999

[54] METHOD FOR FORMING GATE OXIDE LAYERS OF VARIOUS PREDEFINED THICKNESSES

[75] Inventors: Meng-Jin Tsai, Hsinchu-Hsien; Heng-Sheng Huang, Taipei, both of Taiwan

[73] Assignee: United Microelectronics Corp., Taiwan

[21] Appl. No.: 08/877,204

[22] Filed: Jun. 17, 1997

[30] Foreign Application Priority Data

Mar. 17, 1997 [TW] Taiwan .................................. 86103272

[51] Int. Cl.⁶ ....................................................... H01L 21/70
[52] U.S. Cl. ........................... 438/591; 438/591; 438/585; 438/587; 438/981; 438/299; 438/287; 438/283; 438/216; 438/258
[58] Field of Search ...................................... 438/591, 585, 438/400, 414, 424–432, 435–439, 353–363, 216, 2, 218–226, 258, 283, 287, 299, 981, 587

[56] References Cited

U.S. PATENT DOCUMENTS

| | | | |
|---|---|---|---|
| 5,036,018 | 7/1991 | Mazzali | 438/211 |
| 5,183,773 | 2/1993 | Miyata | 438/258 |
| 5,208,179 | 5/1993 | Okazawa | 438/257 |
| 5,212,100 | 5/1993 | Groves et al. | 438/217 |
| 5,336,625 | 8/1994 | Tong | 438/565 |
| 5,427,966 | 6/1995 | Komori et al. | 438/257 |
| 5,656,527 | 8/1997 | Choi et al. | 438/258 |
| 5,716,863 | 2/1998 | Arai | 438/238 |

*Primary Examiner*—Charles Bowers
*Assistant Examiner*—Thanh Nguyen
*Attorney, Agent, or Firm*—Finnegan, Henderson, Farabow, Garrett & Dunner, L.L.P.

[57] ABSTRACT

A method is provided for use in semiconductor fabrication processes for forming a plurality of gate oxide layers with various predefined thicknesses in mixed-mode or embedded circuits that are formed in a semiconductor substrate. In particular, the gate oxide layers of various predefined thicknesses are formed by means of separated growth, which allows all the gate oxide layers to be each formed in one single step, instead of combining two or more oxide layers as in conventional processes, so that the thicknesses can be more easily controllable to the desired levels. The quality of the thus-formed gate oxide layers can thus be better assured.

20 Claims, 6 Drawing Sheets

METHOD FOR FORMING GATE OXIDE LAYERS OF VARIOUS PREDEFINED THICKNESSES

BACKGROUND OF THE INVENTION

1. Field of the Invention

This invention relates to semiconductor fabrication processes, and more particularly, to a method for forming a plurality of gate oxide layers with various predefined thicknesses in mixed-mode or embedded circuitry formed in semiconductor wafers.

2. Description of Related Art

In integrated circuits with MOSFET (metal-oxide semiconductor field-effect transistor) devices, it is usually desired to form associated gate oxide layers with various predefined thicknesses so as to allow the MOSFET devices to have different operating voltages. For instance, at the 0.25 $\mu$m (micrometer) submicron fabrication level, the thickness of the gate oxide layer in one MOSFET device with an operating voltage of 3.3 V (volt) is about 20Å (angstrom) larger than that of the gate oxide layer in another MOSFET device with an operating voltage of 2.5 V. In IC layout schemes, it is a widely used practice to incorporate the 3.3 V I/O (input/output) devices together with the 2.5 V core circuitry in the same module. Therefore, in such an IC, the gate oxide layers are formed with different predefined thicknesses for either 3.3 V or 2.5 V operation. This kind of circuit is customarily referred to as a mixed-mode or embedded circuit. The mixed-mode circuit is widely used in semiconductor memory devices, such as dynamic random access memory (DRAM), I/O drivers, or various other high-voltage components.

A conventional method for forming gate oxide layers with various predefined thicknesses in a mixed-mode circuit is depicted in detail in the following with reference to FIGS. 1A through 1F. In the case of FIGS. 1A through 1F, for example, the method is directed to the forming of a first gate oxide layer with a first predefined thickness of 50 Å and a second gate oxide layer with a second predefined thickness of 70 Å.

Referring first to FIG. 1A, in the first step, a semiconductor substrate 10, such as a silicon substrate, is prepared. Next, a pad oxide layer 12 is formed over the substrate 10, and then a silicon nitride layer 14 is formed over the pad oxide layer 12.

Referring next to FIG. 1B, a plurality of field oxide layers 11 (or trench isolations) are formed by local oxidation of silicon (LOCOS) or shallow-trench isolation (STI) over the substrate 10. These field oxide layers 11 divide the surface area of the wafer into at least one first active region 13 and one second active region 15. In the first active region 13, for example, an internal circuit is to be formed; while in the second active region 15, a peripheral circuit is to be formed. After this, the remaining portions of the silicon nitride layer 14 and the pad oxide layer 12 are entirely removed.

Referring further to FIG. 1C, in the subsequent step, a sacrificial oxide layer (not shown) is formed over the wafer to serve as a mask, and then an ion-implantation process is performed on the wafer so as to form N-wells or P-wells (not shown) in the substrate 10. In these wells, a first NMOS transistor for the internal circuit is to be formed in the first active region 13, while a second NMOS transistor for the peripheral circuit is to be formed in the second active region 15 in later steps. After this, the sacrificial oxide layer is removed. Then, an initial oxide layer 16, such as a layer of silicon dioxide, is formed over the entire top surface of the wafer.

Referring next to FIG. 1D, the subsequent step is to perform a photolithographic and etching process on the wafer so as to remove a selected portion of the initial oxide layer 16 that is layered directly on the first active region 13. The first active region 13 is therefore exposed, while the second active region 15 still remains covered by the initial oxide layer 16. Then, a cleaning process, such as plasma/wet etching, is performed to remove the photoresist layer 15.

Referring further to FIG. 1E, in the subsequent step, a first oxide layer 18, such as a layer of silicon dioxide, is formed over the entire top surface of the wafer to a predefined thickness of 50 Å (this thickness is equal to the smaller of the two predefined thicknesses of the gate oxide layers). The thickness of the composite oxide layer 17 that is to be formed in the region 15 includes the thickness of the thicker oxide layer due to the existence of the initial oxide layer. Then, a conductive layer 19, such as a layer of polycide (a composition of polysilicon and silicide), is formed over the first gate oxide layer 18.

One portion of the first oxide layer 18 that is layered in the first active region 13 serves as the desired first gate oxide layer with a thickness of 50 Å; while the portion of the first gate oxide layer 18 that is layered in the second active region 15 and the underlying portion of the initial oxide layer 16 in combination form a composite oxide layer (designated collectively by the reference numeral 17 in FIG. 1E) which serves as the desired second gate oxide layer with a total thickness of 70 Å.

Referring finally to FIG. 1F, a photolithographic and etching process is then performed on the wafer so as to remove unwanted portions of the conductive layer 19, the oxide layer 18, and the initial oxide layer 16 until the top surface of the substrate 10 is exposed. One remaining portion of the conductive layer 19, as designated by the reference numeral 19a, serves as one gate electrode for the transistor that is to be formed in the first active region 13; while the other remaining portion of the same, as designated by the reference numeral 19b, serves as another gate electrode for another transistor that is to be formed in the second active region 15. The underlying portion of the oxide layer 18 beneath the gate electrode 19a serves as the desired first gate oxide layer with the first predefined thickness of 50 Å; while the underlying portion of the composite oxide layer 17 beneath the gate electrode 19b serves the desired second gate oxide layer with the second predefined thickness of 70 Å.

One drawback to the foregoing method, however, is that the forming of the composite oxide layer would be difficult to be controlled precisely to the desired thickness since the composite oxide layer includes two oxide layers that are formed separately in different steps. As a result of this, the errors in the thickness of the two separate oxide layers due to fluctuations in the fabrication process will compound. The composite oxide layer is also poor in quality. Moreover, since in the removal of selected part of the oxide layer involves the steps of coating and removing photoresist layers, the gate oxide layers will be subjected to plasma damage and contamination by the photoresist.

SUMMARY OF THE INVENTION

It is another objective of the present invention to provide a method for forming gate oxide layers with various predefined thickness which allows the thus formed gate oxide layers to have more precise thicknesses and involves no steps of coating and removing photoresist layers so that the gate oxide layers will not be subjected to plasma damage and contamination by photoresist.

In accordance with the foregoing and other objectives of the present invention, a new method for forming gate oxide layers with various predefined thicknesses is provided. Two various embodiments of the method according to the invention are disclosed.

The first embodiment of the method of the invention includes the following steps:

(1) preparing a semiconductor substrate;

(2) forming a plurality of field oxide layers on the substrate, which divide the substrate area into at least one first active region and one second active region;

(3) forming a first oxide layer to serve as the first gate oxide layer to the first predefined thickness over the field oxide layer and exposed surfaces of the substrate, and then forming a first conductive layer over the first gate oxide layer;

(4) forming a passivation layer over the first conductive layer;

(5) removing selected portions of the passivation layer, the first conductive layer, and the first gate oxide layer that are layered in the first active region so as to expose a surface area of the substrate in the first active region;

(6) forming a second oxide layer serving as the second gate oxide layer to the second predefined thickness over the substrate, and then forming a second conductive layer over the second gate oxide layer;

(7) removing a selected portion of the second conductive layer that is layered directly above the passivation layer in the second active region;

(8) removing the passivation layer; and (9) defining a plurality of gates from the first and second conductive layers and the first and second gate oxide layers.

The second embodiment of the method, which involves the combination of trench formation, includes the following steps:

(1) preparing a semiconductor substrate;

(2) forming a first oxide layer to serve as the first gate oxide layer to the first predefined thickness over the substrate, and then forming a first conductive layer over the first gate oxide layer;

(3) forming a passivation layer over the first conductive layer;

(4) forming a plurality of trenches at selected locations on the substrate so as to define at least one first active region and one second active region on the substrate;

(5) forming an isolation oxide layer over the substrate which fills up the trenches;

(6) removing a selected thickness of the isolation oxide layer that is layered above the passivation layer, the remaining portions of the isolation oxide layer in the trenches serving as a plurality of trench isolators;

(7) removing selected portions of the passivation layer, the first conductive layer, and the first gate oxide layer that are layered in the first active region so as to expose a surface area of the substrate in the first active region;

(8) forming a second oxide layer to serve as the second gate oxide layer to the second predefined thickness over the substrate, and then forming a second conductive layer over the second gate oxide layer;

(9) removing selected portions of the second conductive layer and the second gate oxide layer that are layered in the second active region;

(10) removing the passivation layer; and

(11) defining a plurality of gates from the first and second conductive layers and the first and second gate oxide layers.

The method of the invention allows all of the gate oxide layers, regardless of whether they are thin or thick, to be formed by one single growth process, and not by two or more growth processes to form composite gate oxide layers, such that the thicknesses are more controllable to the desired levels.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Two preferred embodiments of the method according to the invention for forming a plurality of gate oxide layers with various predefined thicknesses are disclosed in full detail in the following with reference respectively to FIGS. 2A through 2F and FIGS. 3A through 3F.

In the following two preferred embodiments, for example, the process steps pertain to forming a first gate oxide layer with a first predefined thickness of 70 Å and a second gate oxide layer with a second predefined thickness of 50 Å. However, broadly speaking, the method of the invention can be used to form a plurality of gate oxide layers with any number of different predefined thicknesses.

First Preferred Embodiment

The first preferred embodiment of the method according to the invention is described in full detail in the following with reference to FIGS. 2A through 2F.

Figure 1A:
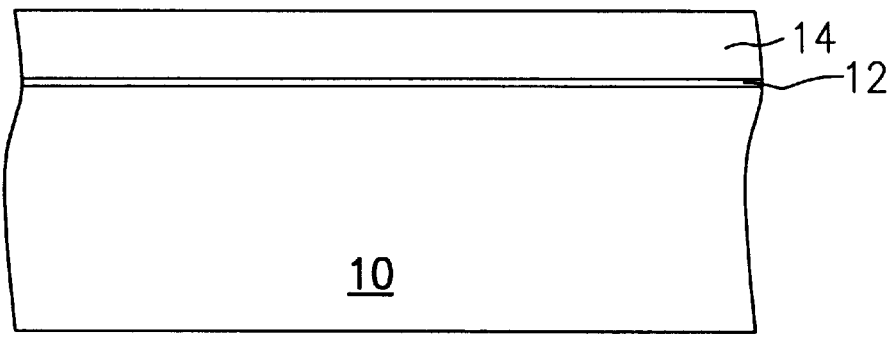
FIGS. 1A through 1F are schematic sectional diagrams used to depict the steps involved in a conventional method for forming gate oxide layers with various predefined thicknesses.
Figure 1B:
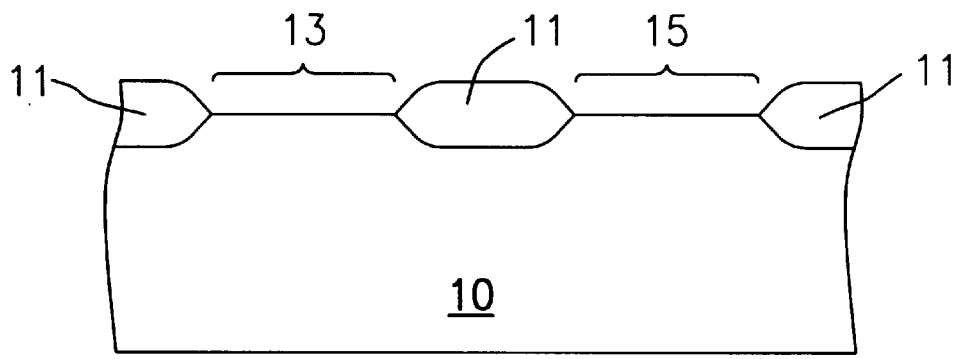
Figure 1C:
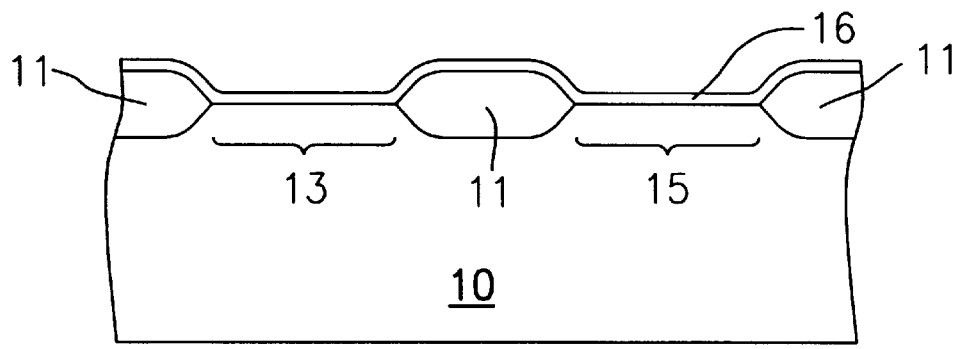
Figure 1D:
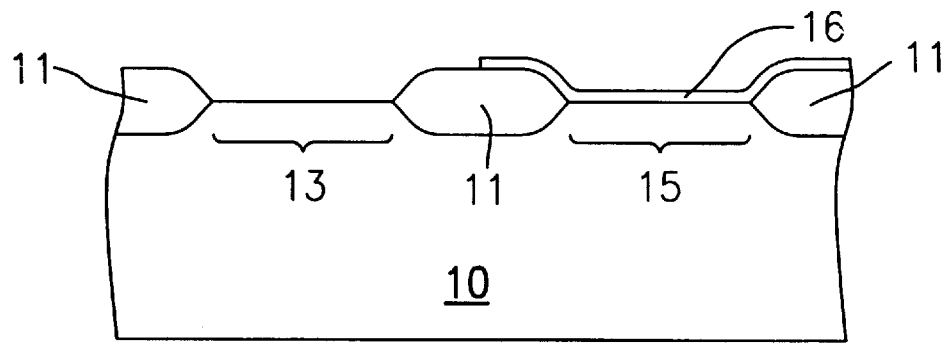
Figure 1E:
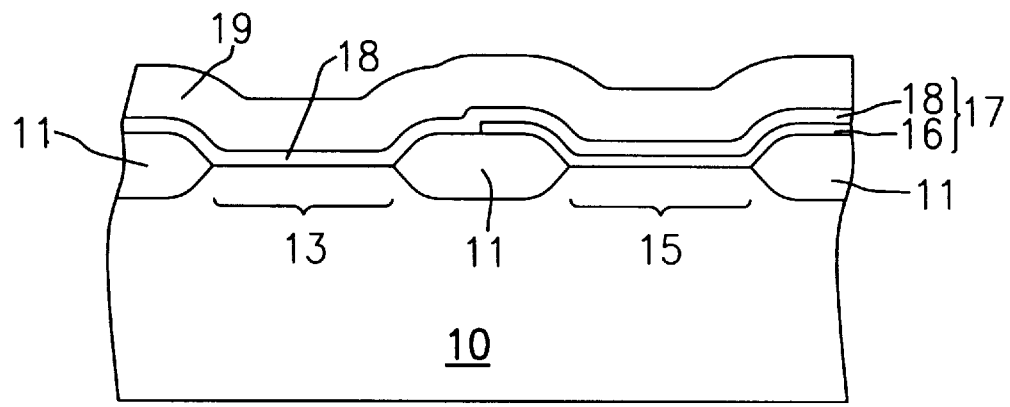
Figure 1F:
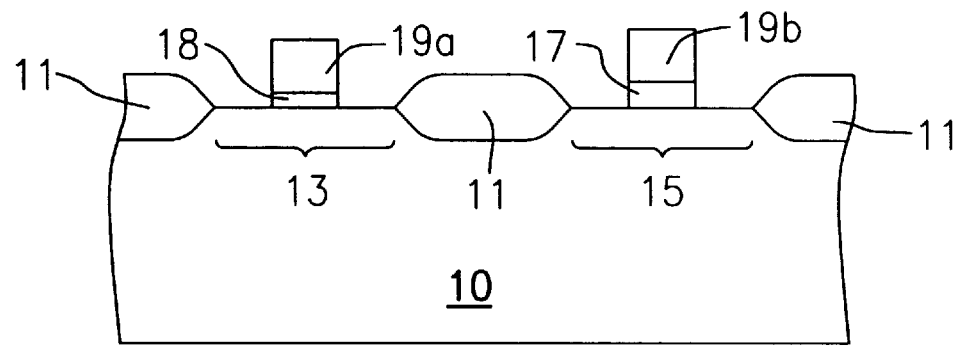
Figure 2A:
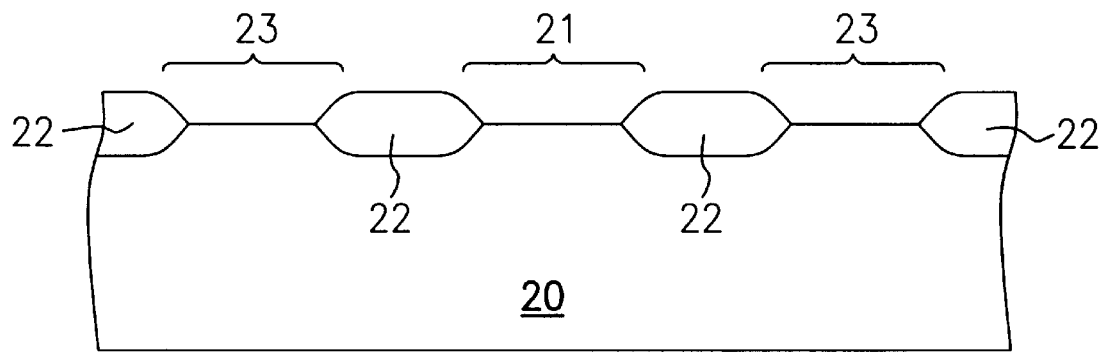
FIGS. 2A through 2F are schematic sectional diagrams used to depict the steps involved in a first preferred embodiment of the method according to the invention for forming gate oxide layers with various predefined thicknesses.

Referring first to FIG. 2A, in the first step, a semiconductor substrate 20, such as a silicon substrate, is prepared. Next, a plurality of field oxide layers 22 are formed at predefined locations on the substrate 20, which divide the substrate surface into at least one first active region 21 and one second active region 23. In the first active region 21, an internal circuit is to be formed; while in the second active region 23, a peripheral circuit is to be formed. The forming of the internal circuit and the peripheral circuit on the same substrate constitutes a so-called mixed-mode circuit.

Figure 2B:
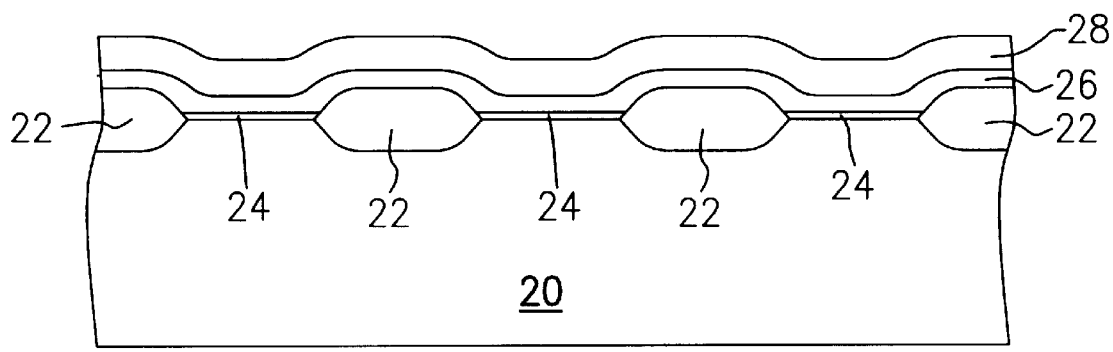

Referring next to FIG. 2B, in the subsequent step, a first gate oxide layer 24, such as a layer of silicon dioxide, is formed over the second active region 23 to a first predefined thickness, for example 70 Å. Next, a first conductive layer 26, such a layer of polycide (a composition of polysilicon and silicide), is formed over the entire top surface of the wafer; and then a passivation layer 28, such as a layer of silicon dioxide, silicon nitride, or silicon-oxy-nitride, is formed over the first conductive layer 26 to a thickness of 1,000 to 3,000 Å.

Figure 2C:
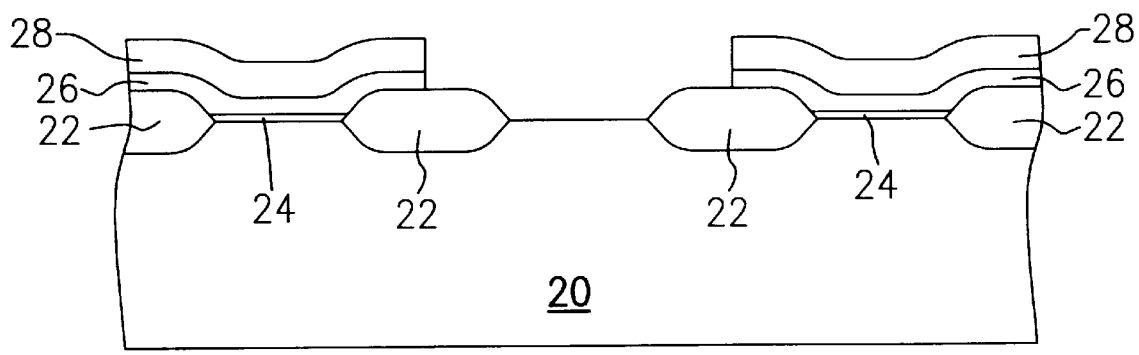

Referring further to FIG. 2C, in the subsequent step, a photolithographic and etching process is performed on the wafer so as to remove selected portions of the passivation layer 28 and the first conductive layer 26 that are layered in the first active region 21 until the top surface of the substrate 20 in the first active region 21 is exposed.

Figure 2D:
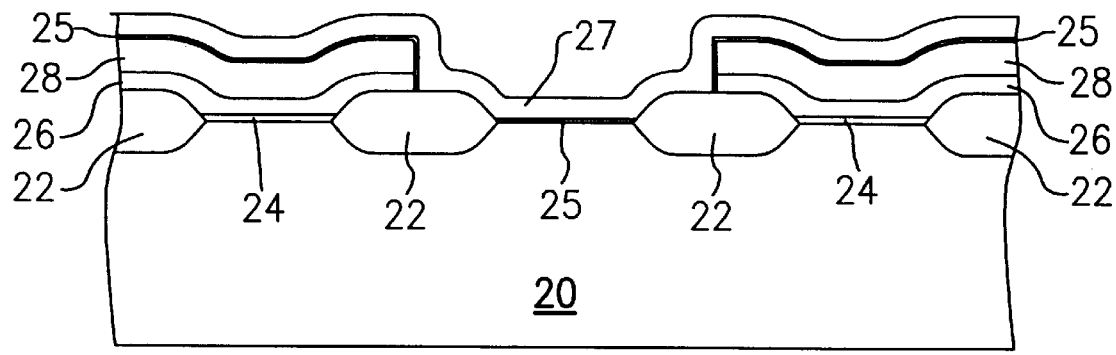

Referring next to FIG. 2D, in the subsequent step, a second gate oxide layer 25 is formed over the exposed surface of the wafer to a second predefined thickness, for example 50 Å. Then, a second conductive layer 27, such a layer of polycide (a composition of polysilicon and silicide), is formed over the second gate oxide layer 25.

Figure 2E:
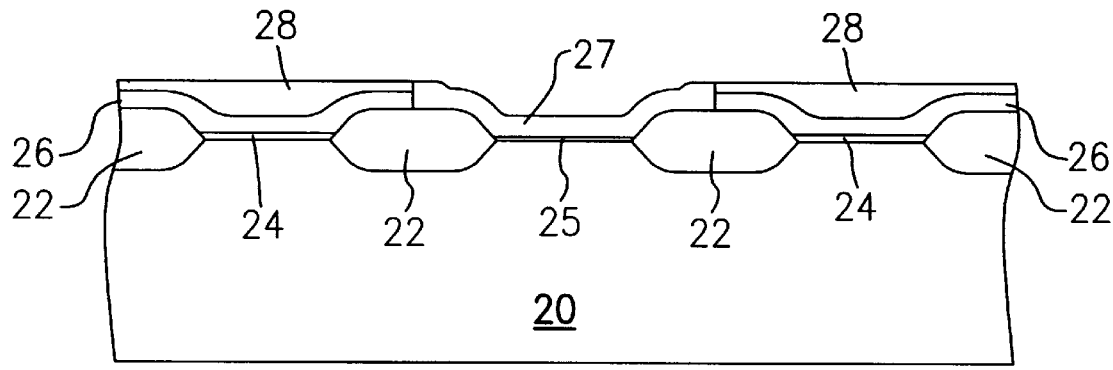

Referring further to FIG. 2E, in the subsequent step, a chemical-mechanical polishing (CMP) process is performed on the wafer using the passivation layer 28 as an end-point detector so as to remove selected portions of the second conductive layer 27 and second gate oxide layer 25 that are layered in the second active region 23.

Figure 2F:
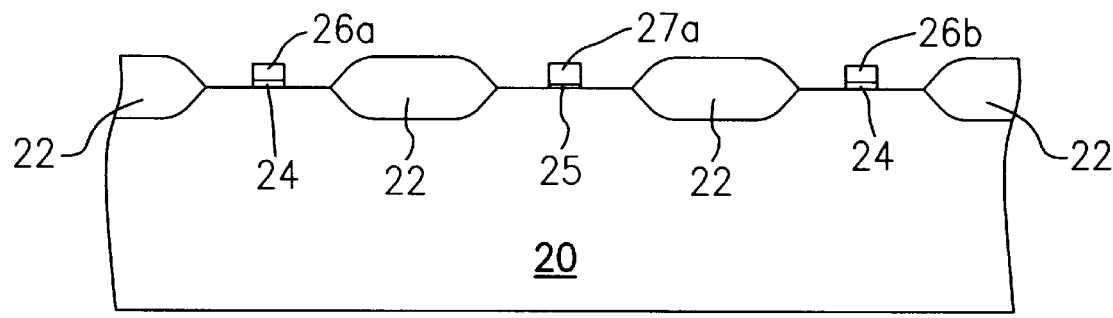

Referring finally to FIG. 2F, in the subsequent step, the remaining portions of the passivation layer 28 above the second active region 23 are removed. Then, a photolithographic and etching process is performed on the wafer so as to remove selected portions of the first conductive layer 26 and the first gate oxide layer 24 in the second active region 23, and selected portions of the second conductive layer 27 and the second gate oxide layer 25 in the first active region 21. The remaining portions of the first conductive layer 26, as indicated by the reference numerals 26a, 26b, serve as first gates for the NMOS transistors formed in the second active region 23; while the remaining portion of the second conductive layer 27 in the first active region 21, as indicated by the reference numeral 27a, serves as a second gate.

In the example described above, the first gate oxide layers 24 beneath the first gates 26a, 26b in the second active region 23 are formed with the first predefined thickness of 70 Å; while the second gate oxide layer 25 beneath the second gate 27a in the first active region 21 is formed with the second predefined thickness of 50 Å. This completes the forming of two gate oxide layers each with a different predefined thickness.

Alternatively, the step for forming the gate in the first active region 21 and the step for forming the gate in the second active region 23 can be interchanged in sequence. That is, in the step described with reference to FIG. 2B, the second gate oxide layer 25 can be formed instead of the first gate oxide layer 24; then in the step described with reference to FIG. 2C, a top surface of the substrate 20 in the second active region 23 is exposed; and in the step described with reference to FIG. 2D, the first gate oxide layer 24 is formed. The other process steps remain unaltered.

Second Preferred Embodiment

The second preferred embodiment of the method according to the invention is described in full detail in the following with reference to FIGS. 3A through 3F.

Figure 3A:
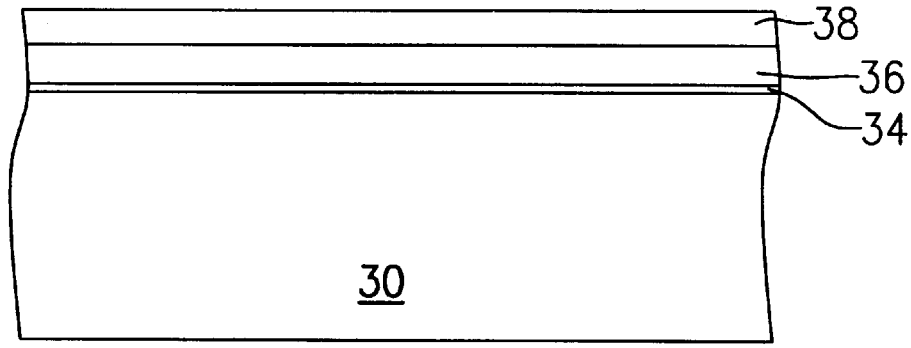
FIGS. 3A through 3F are schematic sectional diagrams used to depict the steps involved in a second preferred embodiment of the method according to the invention for forming gate oxide layers with various predefined thicknesses.

Referring first to FIG. 3A, in the first step, a semiconductor substrate 30, such as a silicon substrate, is prepared. Next, a first gate oxide layer 34, such as a layer of silicon dioxide, is formed over the substrate 30 to a first predefined thickness, for example 70Å; and then a first conductive layer 36, such as a layer of polycide (a composition of polysilicon and silicide), is formed over the first gate oxide layer 34. After this, a passivation layer 38, such as a layer of silicon dioxide, silicon nitride, or silicon-oxy-nitride, is formed over the first conductive layer 36 to a thickness of 1,000 to 3,000 Å.

Figure 3B:
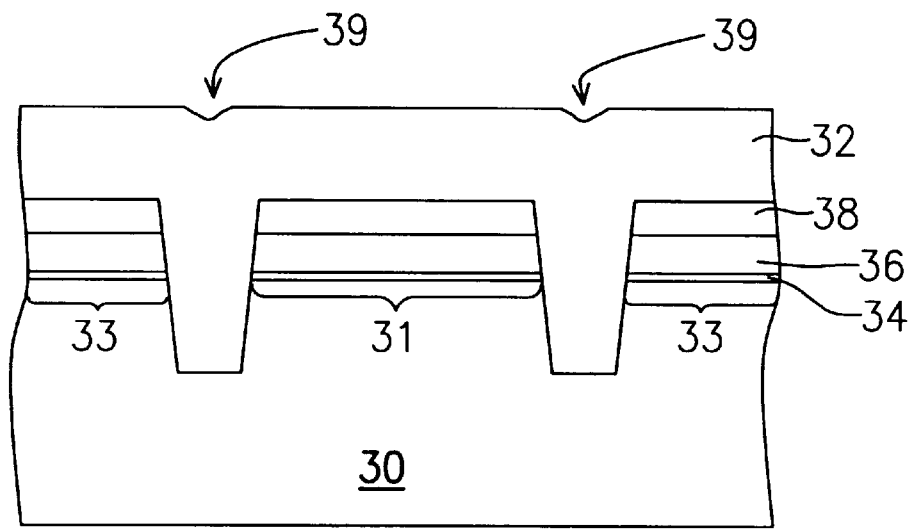

Referring next to FIG. 3B, if the passivation layer 38 formed in the previous step is a layer of silicon nitride, it can be used directly in the process for forming shallow-trench isolators (STI) without the need to form another layer of silicon nitride. The overall process can thus be simplified. In the subsequent step, a photolithographic and etching process, in which the dry-etching process is used, is performed on the wafer so as to form a plurality of trenches 39 at selected locations on the wafer to a predefined depth in the substrate 30. These trenches 39 divide the wafer area into at least one first active region 31 and one second active region 33. In the first active region 31, an internal circuit is to be formed; while in the second active region 33, a peripheral circuit is to be formed. The forming of the internal circuit and the peripheral circuit on the same substrate constitutes a so-called mixed-mode circuit.

After this, an isolation oxide layer 32 is formed over the entire top surface of the wafer, which also fills up the trenches 39. This isolation oxide layer 32 can be, for example, a layer of silicon dioxide which is formed by chemical-vapor deposition (CVD) of TEOS/$O_3$ (a mixture of tetra-ethyl-ortho-silicate and ozone).

Figure 3C:
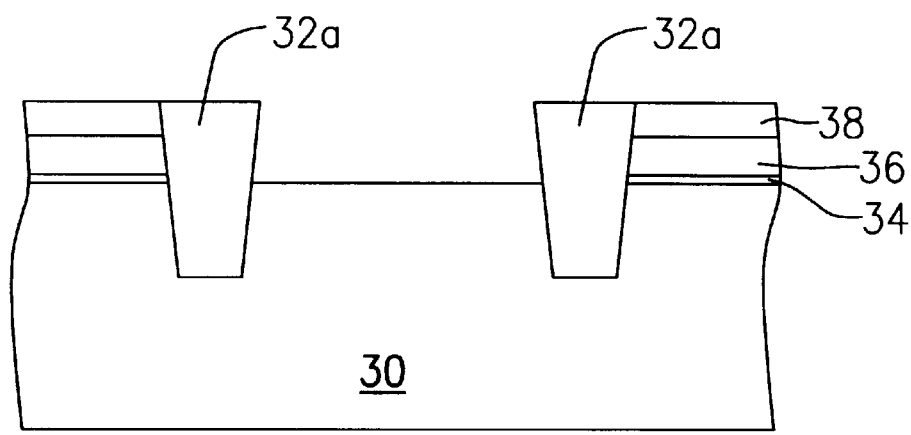

Referring further to FIG. 3C, in the subsequent step, chemical-mechanical polishing (CMP) is performed on the wafer so as to polish away a selected thickness of the isolation oxide layer 32 that is layered above the top surface of the passivation layer 38. The remaining portions of the isolation oxide layer 32 are only left in the trenches 39, as designated by the reference numeral 32a, which serve as shallow-trench isolators. After this, a photolithographic and etching process is performed on the wafer so as to remove selected portions of the passivation layer 38, the first conductive layer 36, and the first gate oxide layer 34 that are layered in the first active region 31 confined within the shallow-trench isolators 32a.

Figure 3D:
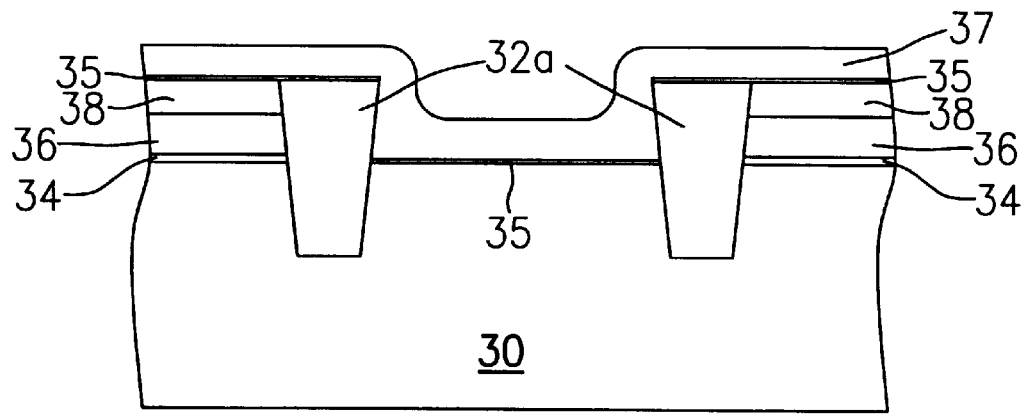

Referring next to FIG. 3D, in the subsequent step, a second gate oxide layer 35 is formed over the wafer, partly over the top surface of the substrate 30 in the first active region 31 and partly over the top surface of the shallow-trench isolators 32a and the passivation layer 38, to a second predefined thickness, for example 50 Å. After this, a second conductive layer 37 is formed over the second gate oxide layer 35.

Figure 3E:
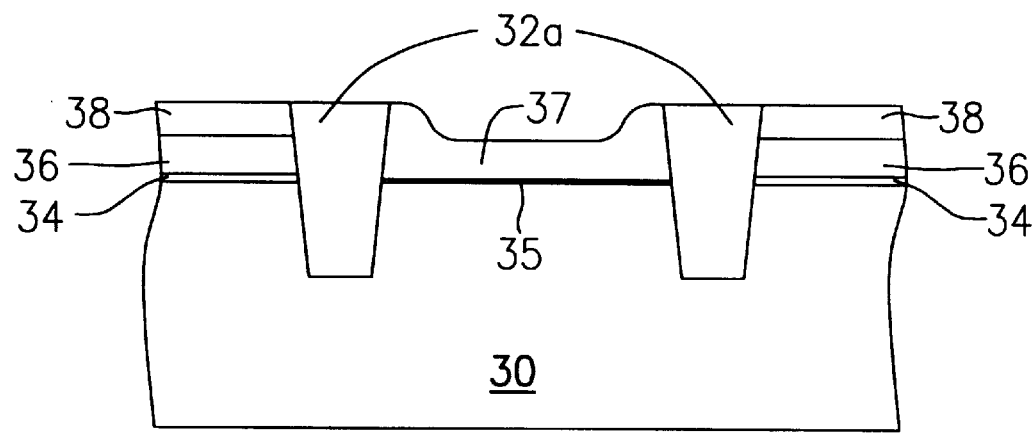

Referring next to FIG. 3E, in the subsequent step, a chemical-mechanical polishing (CMP) process is performed on the wafer using the passivation layer 38 as end-point detector so as to remove those portions of the second conductive layer 37 and second gate oxide layer 35 that are layered directly above the second active region 33.

Figure 3F:
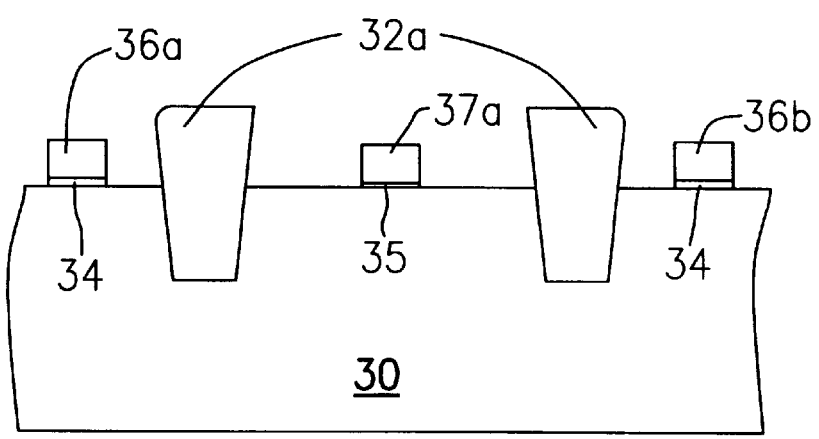

Referring finally to FIG. 3F, in the subsequent step, the remaining portions of the passivation layer 38 above the second active region 33 are removed. Then, a photolithographic and etching process is performed on the wafer so as to remove selected portions of the first conductive layer 36 and the first gate oxide layer 34 in the second active region 33, and selected portions of the second conductive layer 37 and the second gate oxide layer 35 in the first active region 31. The remaining portions of the first conductive layer 36 in the second active region 33, as designated by the reference numerals 36a, 36b, serve as first gates for the NMOS transistors formed in the second active region 33; while the remaining portion of the second conductive layer 37 in the first active region 31, as designated by the reference numeral 37a, serves as a first gate for the NMOS transistor formed in the first active region 31.

In the example described above, the first gate oxide layer 34 beneath the first gates 36a, 36b is formed with the first predefined thickness of 70 Å; while the second gate oxide layer 35 beneath the first gate 37a is formed with the second predefined thickness of 50 Å. This completes the forming of a plurality of gate oxide layers with two different predefined thicknesses.

In the foregoing second preferred embodiment of the method, as described in the first preferred embodiment, the step for forming the gate in the first active region 31 and the step for forming the gate in the second active region 33 can be interchanged in sequence.

One feature of the invention is that the separated growth allows the forming of more precise thicknesses for the gate oxide layers. Moreover, the use of the photolithographic and etching process and CMP process allows the gate oxide layers to be formed at any desired locations on the substrate. Although the foregoing two preferred embodiments pertain to the forming of gate oxide layers with two different predefined thicknesses, the process of the invention can be broadly used to form a plurality of gate oxide layers with any number of different predefined thicknesses.

In conclusion, the method of the invention has several advantages over the prior art. First, all of the gate oxide layers, regardless of whether they are thin or the thick, are formed by one growth process, and not by two or more growth processes to form composite gate oxide layers, such that the thicknesses are more controllable to the desired levels. Second, the separated growth allows the prevention of contamination to the thus formed gate oxide layers so that their quality is assured. Third, the step for forming the thick gate oxide layers and the step for forming the thin gate oxide layers can be interchanged, so that the fabrication process is flexible. Fourth, the method is suitable for use in the fabrication of mixed-mode circuits that require the forming of gate oxide layers with at least two different thicknesses. Fifth, in the second preferred embodiment, if the passivation layer is a layer of silicon nitride, the overall fabrication process can be simplified since one process step can be eliminated.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for forming a plurality of gate oxide layers including a first gate oxide layer with a first predefined thickness and a second gate oxide layer with a second thickness, comprising the steps of:
   (1) preparing a semiconductor substrate;
   (2) forming a plurality of field oxide layers on the substrate, which divide the substrate area into at least one first active region and one second active region;
   (3) forming a first oxide layer to serve as the first gate oxide layer to the first thickness over the field oxide layer and exposed surfaces of the substrate, and then forming a first conductive layer over the first gate oxide layer;
   (4) forming a passivation layer over the first conductive layer;
   (5) removing selected portions of the passivation layer, the first conductive layer, and the first gate oxide layer that are layered in the first active region so as to expose a surface area of the substrate in the first active region;
   (6) forming a second oxide layer to serve as the second gate oxide layer to the second thickness over the substrate, and then forming a second conductive layer over the second gate oxide layer;
   (7) removing a selected portion of the second conductive layer that is layered directly above the passivation layer in the second active region;
   (8) removing the passivation layer; and
   (9) defining a plurality of gates from the first and second conductive layers and the first and second gate oxide layers.

2. The method of claim 1, wherein said semiconductor substrate is a silicon substrate.

3. The method of claim 1, wherein in said step (5), the selected portions of the passivation layer are removed by a photolithographic and etching process.

4. The method of claim 1, wherein the first and second conductive layers are each a layer of polycide which is a composition of polysilicon and silicide.

5. The method of claim 1, wherein the passivation layer is a layer of silicon dioxide.

6. The method of claim 1, wherein the passivation layer is a layer of silicon nitride.

7. The method of claim 1, wherein the passivation layer is a layer of silicon-oxy-nitride.

8. The method of claim 1, wherein the passivation layer is formed to a thickness of 1,000 to 3,000 Å.

9. The method of claim 1, wherein in said step (7), the removing of the selected thickness of the second conductive layer is carried out by performing a CMP process using the passivation layer as an end-point detector.

10. A method for forming a plurality of gate oxide layers including a first gate oxide layer with a first thickness and a second gate oxide layer with a second thickness, comprising the steps of:
   (1) preparing a semiconductor substrate;
   (2) forming a first oxide layer to serve as the first gate oxide layer to the first thickness over the substrate, and then forming a first conductive layer over the first gate oxide layer;
   (3) forming a passivation layer over the first conductive layer;
   (4) forming a plurality of trenches at selected locations on the substrate so as to define at least one first active region and one second active region on the substrate;
   (5) forming an isolation oxide layer over the substrate which fills up the trenches;
   (6) removing a selected thickness of the isolation oxide layer that is layered above the passivation layer, the remaining portions of the isolation oxide layer in the trenches serving as a plurality of trench isolators;
   (7) removing selected portions of the passivation layer, the first conductive layer, and the first gate oxide layer that are layered in the first active region so as to expose a surface area of the substrate in the first active region;
   (8) forming a second oxide layer to serve as the second gate oxide layer to the second thickness over the substrate, and then forming a second conductive layer over the second gate oxide layer;
   (9) removing selected portions of the second conductive layer and the second gate oxide layer that are layered in the second active region;

(10) removing the passivation layer; and

(11) defining a plurality of gates from the first and second conductive layers and the first and second gate oxide layers.

11. The method of claim 10, wherein said semiconductor substrate is a silicon substrate.

12. The method of claim 10, wherein in said step (4), the trenches are formed by a photolithographic and dry-etching process.

13. The method of claim 10, wherein in said step (5), the isolation oxide layer is a layer of silicon dioxide.

14. The method of claim 13, wherein in said step (5), the silicon dioxide is formed by chemical-vapor deposition (CVD) of TEOS/$O_3$.

15. The method of claim 10, wherein in said step (6), the selected thickness of the passivation layer is removed by a CMP process.

16. The method of claim 10, wherein the first and second conductive layers are each a layer of polycide which is a composition of polysilicon and silicide.

17. The method of claim 10, wherein the passivation layer is a layer of silicon dioxide.

18. The method of claim 10, wherein the passivation layer is a layer of silicon-oxy-nitride.

19. The method of claim 10, wherein the passivation layer is formed to a thickness of 1,000 to 3,000 Å.

20. The method of claim 10, wherein in said step (9), the removal of the selected thickness of the second conductive layer is carried out by performing a CMP process using the passivation layer as an end-point detector.

* * * * *